United States Patent [19]

Wada et al.

[11] Patent Number: 4,655,875
[45] Date of Patent: Apr. 7, 1987

[54] ION IMPLANTATION PROCESS

[75] Inventors: Yasuo Wada, Bunkyo; Masao Tamura, Tokorozawa; Nobuyoshi Natsuaki, Higashiyamato; Kiyonori Ohyu, Hachioji, all of Japan

[73] Assignee: Hitachi, Ltd., Tokyo, Japan

[21] Appl. No.: 836,233

[22] Filed: Mar. 4, 1986

[30] Foreign Application Priority Data

Mar. 4, 1985 [JP] Japan .................................. 60-41116
Oct. 23, 1985 [JP] Japan .................................. 60-235150

[51] Int. Cl.⁴ .......................... B44C 1/22; C23C 1/02; C03C 15/00; C03C 25/06
[52] U.S. Cl. ...................................... 156/643; 29/571; 29/576 B; 29/576 W; 148/187; 156/652; 156/653; 156/656; 156/657; 156/659.1; 204/192.32

[58] Field of Search ............... 156/643, 646, 652, 653, 156/656, 657, 659.1, 662; 148/1.5, 187; 29/576 B, 576 W, 571; 427/85; 204/192 E

[56] References Cited

U.S. PATENT DOCUMENTS

| 4,441,931 | 4/1984 | Levin | 148/187 X |
| 4,515,654 | 5/1985 | Cline | 148/187 X |
| 4,523,369 | 6/1985 | Nagakubo | 148/187 X |

Primary Examiner—William A. Powell
Attorney, Agent, or Firm—Antonelli, Terry & Wands

[57] ABSTRACT

Ions having a high energy is implanted using a mask of a stacked film consisting of a film formed from an amorphous material and a film formed from a metal having a large mass number.

In this way, penetration of ions can be prohibited by a mask having a far smaller thickness than that of the conventional mask. Thus ions having a high energy can be implanted with a very high accuracy.

10 Claims, 14 Drawing Figures

ION IMPLANTATION PROCESS

BACKGROUND OF THE INVENTION

The present invention relates to a process for ion implantation in the production of semiconductor devices etc. and more specifically to an ion implantation process particularly suitable for ion implantation with a high energy (acceleration energy of 500 keV or more).

According to the conventional process of ion implantation in the production of semiconductor devices etc., a photoresist film, a silicon dioxide (hereinafter referred to briefly as "$SiO_2$") film, or the like is used as the mask in ion implantation in desired portions of a semiconductor substrate to selectively implant ions only in the desired portions. However, since the ion energy loss in the mask of a material such as a photoresist or $SiO_2$ is small, a very thick film having a thickness exceeding a practical limit must be formed in order to exert a sufficient masking effect in ion implantation with a high energy.

This will be explained in further detail. In an example of boron ion (hereinafter referred to briefly as "$B^+$") implantation, the following relationship is generally obtained for resist or $SiO_2$ materials in providing a complete function of a mask in ion implantation by completely prohibiting penetration of $B^+$ therethrough:

$$Y = X/85 \quad (1)$$

wherein the ion implantation energy is X (keV) and the minimum necessary thickness is Y ($\mu$m).

For example, a mask having a thickness of 0.6 $\mu$m is necessary for $B^+$ implantation with an acceleration energy of 50 keV. Since the equation (1) is one established with no consideration of variation in practicing the process, a margin of 10% is usually considered necessary in taking into account for both the film thickness and the ion implantation energy to add up to a 20% increase. Thus the actually necessary film thickness of the mask material is 0.72 $\mu$m (=0.6×1.2).

Figure 2:
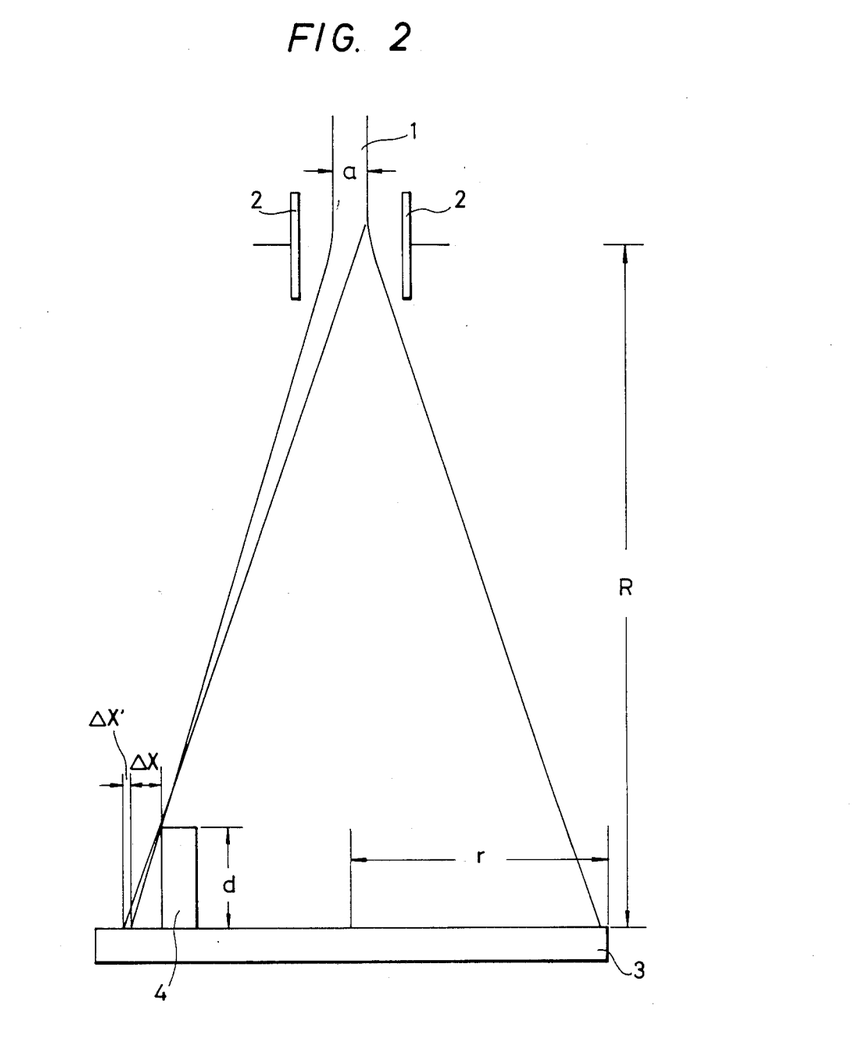
FIG. 2 is a view illustrating a problem arising in ion implantation with a mask having large thickness.

The film thickness required of a mask in ion implantation with a high acceleration energy is calculated to be found impracticable, for example, about 14 $\mu$m (1000/85×1.2) with an acceleration energy of 1 MeV. Specifically, it is actually next to impossible to form a film having a thickness of 10 $\mu$m or more and a width of 1 $\mu$m or less with an accuracy of about 0.1 $\mu$m. When the film thickness of the mask is large as mentioned above, there appear portions where no ion is implanted under an influence of the shadow of the mask in the end portions of the mask. This will be explained in a little more detail. As shown in FIG. 2, when an ion beam 1 with an ion beam diameter of a is implanted in a wafer 3 with a radius of r placed at a distance of R from a scanning system 2, a shadow width $\Delta X$ at a film thickness d of a mask film 4 in a peripheral portion of the wafer 3 is expressed by the following equation:

$$\Delta X = dr/R \quad (2)$$

On the other hand, a penumbral blur width $\Delta X'$ due to an ion beam with a beam diameter of a is expressed by the following equation (3):

$$\Delta X' = ar/R \quad (3)$$

Representative values, i.e. R=1 m, r=6 cm, and a=3 cm, employed in a usual ion implantation apparatus are substituted to calculate $\Delta X$ and $\Delta X'$, which are found to be 0.7 $\mu$m and 0.35 $\mu$m, respectively, with a film thickness of 14 $\mu$m.

About 1/10 of the minimum feature size is necessary in the dimensional accuracy of an ion-implanted region. For example, when the minimum feature size is 1 $\mu$m, the sum of values of $\Delta X$ and $\Delta X'$ must be about 0.1 $\mu$m or less. Accordingly, the film thickness of the mask must be at most 2 $\mu$m. However, the conventional mask employed in ion implantation cannot prohibit penetration of ions having a high energy when it has such a small film thickness.

SUMMARY OF THE INVENTION

An object of the present invention is to provide an ion implantation process which can solve the above-mentioned problems of the conventional ion implantation process, and which can selectively implant ions having high energy in desired regions with high accuracy.

Another object of this invention is to provide an ion implantation process which can selectively implant in desired portions with a high accuracy while prohibiting penetration of ions having a high energy by a mask having a sufficiently small thickness.

In order to attain the above-mentioned objects, in the present invention, a stacked film consisting of a film formed from a material providing an electronic energy loss for ions with high energy and a film formed from a material providing a nuclear energy loss for ions with low energy are used without an excessively large film thickness of a mask to effectively prohibit penetration of ions having a high energy.

DETAILED DESCRIPTION OF THE PREFERRED EMBODIMENTS

The constitution according to the present invention will be described with reference to FIG. 1. A mask of a two-layer structure composed of a first film 12 and a second film 13 is formed on a substrate 11. A film of a material having a large mass number and providing a large electronic energy loss on the side of high energies, such as tungsten or molybdenum, is used as the first film 12 which is an upper layer. On the other hand, a film of an organic material such as one of various photoresists, electron beam resists, X-ray resists, and polyimides, or a material having an amorphous structure and providing a large nuclear energy loss on the side of low energies, such as $SiO_2$ or phosphosilicate glass, is used as the second film 13 which is a lower layer.

A phenomenon that ions are implanted in a silicon substrate or the like underneath a mask due to penetration of ions through the crystalline mask because of insufficiency of the mask in capacity of prohibiting the penetration of ions is called "channeling". Where usual ion implantation with an acceleration energy of about several tens of keV is applied with a mask of, for example, a tungsten or molybdenum film, the above-mentioned channeling is liable to occur and ions are sometimes implanted in regions where ions are not essentially to be implanted because these materials having a large mass number are insufficient in capacity of prohibiting penetration of ions having a low energy. Therefore, in the above-mentioned usual ion implantation, an amorphous film such as SiO$_2$, phosphosilicate glass, or one of various resists having a high capacity of prohibiting the penetration of low-energy ions is used as the mask.

In the present invention, since the first film 12 as the upper layer is formed from a material having a large mass number, such as tungsten or molybdenum, the energy of ions implanted in the film with high energy is very effectively absorbed in the film mainly due to the electronic energy loss, thereby markedly lowering the energy of the ions.

However, since the film formed from the material having a large mass number has a low capacity of prohibiting penetration of ions having a low energy as described above due to channeling, ions having an energy decreased by the above-mentioned electronic energy loss enter the above-mentioned second film 13 as the lower layer after losing sufficient energy by the first film 12 and penetrating through the above-mentioned first film 12.

Since the second film 13 is formed from an amorphous material having a very high capacity of prohibiting penetration of ions having a low energy, such as SiO$_2$, phosphosilicate glass, one of various polymer resins, or one of various resists, ions having a low energy after penetration through the first film 12 are protected from further penetration by the second film 13, so that the arrival of ions in the substrate 11 can be effectively prevented.

In short, according to the present invention, most of the energy of ions is absorbed in the first film formed from a material having a high capacity of energy absorption, and occurrence of channeling is prevented by the second film formed from an amorphous material having a high capacity of prohibiting penetration of ions having a low energy.

Accordingly, no increase in the thicknesses of the first and second films is necessary. Thus sufficient reduction in the thicknesses is possible.

Therefore, there is no fear of the above-mentioned penumbral blur occurring because of a large thickness of the mask. Besides, high-precision impurity doping can be realized by ion implantation with a high energy since a mask can be formed by high-precision patterning.

The film thickness of the mask to be used in the present invention will now be described.

Where B+ implantation is applied using a mask formed from an amorphous material such as SiO$_2$, phosphosilicate glass, or a resist, the relationship between the energy of ions and the film thickness of the mask necessary for prohibiting penetration of ions is expressed by the equation (1) as described above.

On the other hand, where a mask formed from a metal having a large mass number, such as tungsten or molybdenum, is used, the film thickness t ($\mu$m) of the mask necessary for prohibiting penetration of ions having an acceleration energy E (MeV) is expressed by the following equation (4) unlike the above-mentioned case:

$$t = k\sqrt{E} \tag{4}$$

wherein k is a constant dependent upon the kind of ions implanted, for example, 0.9 for boron ions, 0.45 for phosphorus ions, and 0.32 for arsenic ions. The units of E and t are MeV and $\mu$m, respectively. Thus, in order to prohibit penetration of boron ions with an acceleration energy of, for example, 1 MeV, a film thickness of about 1.0 $\mu$m may be sufficient even with due consideration of a process margin of 10%. It can be further understood that a film thickness of 0.5 $\mu$m is sufficient in the case of phosphorus ions with the same acceleration energy as mentioned above, while a film thickness of 0.35 $\mu$m is sufficient in the case of arsenic ions with the same acceleration energy. When the acceleration energy is 2 MeV, film thickness of about 1.4 $\mu$m, 0.7 $\mu$m, and 0.52 $\mu$m are sufficient in cases of boron, phosphorus, and arsenic ions, respectively. Thus a mask having a desired pattern can be easily formed with a high accuracy.

In ion implantation with a mask of a heavy metal such as tungsten or molybdenum, however, the mask cannot completely serve as such particularly at low energies of ions having a large mass number, at which energies the nuclear energy loss becomes predominant because of liability to channeling as described above. The energy limit over which a mask formed from a heavy metal can be used as the mask is dependent on the mass number of the ions, and is, for example, 10 to 20 KeV for boron, about 100 KeV for phosphorus, and about 300 KeV for arsenic. Since ions having an energy equal to or below the energy limit cannot be blocked by a heavy metal film, and blocking of them with the second film (lower layer) formed from an amorphous material is necessary. The necessary film thicknesses of the mask formed from an amorphous material of SiO$_2$, a resist, PSG, or the like against boron ions, phosphorus ions, and arsenic ions are about 0.1 $\mu$m, 0.2 $\mu$m, and 0.3 $\mu$m, respectively. The film thicknesses of the masks necessary for prohibiting penetration of the above-mentioned ions with various acceleration energies can be calculated from the equation (4) and these necessary film thicknesses of the second films. Needless to say, the film thickness of the mask in the case of other ions can also be calculated in the same way if only the film thickness of the second film as the lower layer and the value of k as mentioned above can be experimentally found.

The experiment made by the inventors of this invention has revealed that the necessary film thickness t' of the second film as the ion implantation mask can be substantially expressed by the square root of the mass number M of ions to be implanted according to the following equation (5):

$$t' = 1/\sqrt{M} \tag{5}$$

For example, in the case of implantation of silicon ions at 1 MeV, an amorphous film having a thickness of about 0.2 $\mu$m is satisfactory for use as the second film according to the equation 5 since the mass number of silicon is 28.

It was confirmed that the value of k as mentioned above in silicon ion implantation is 0.53 according to the experiment. Thus a thickness of the first film (heavy metal film) of about 0.53 $\mu$m is sufficient with an acceleration energy of 1 MeV.

Specifically, in silicon ion implantation with an acceleration energy of 1 MeV, use of a stacked film consisting of the first film of a heavy metal having a thickness of at least about 0.53 μm and the second film of an amorphous material having a thickness of at least about 0.2 μm can effectively prohibit penetration of the above-mentioned silicon ions.

Since the thickness of the above-mentioned stacked film is merely about 0.73 μm, a mask having a desired pattern can, needless to say, be very easily formed with a high accuracy.

Figure 1:
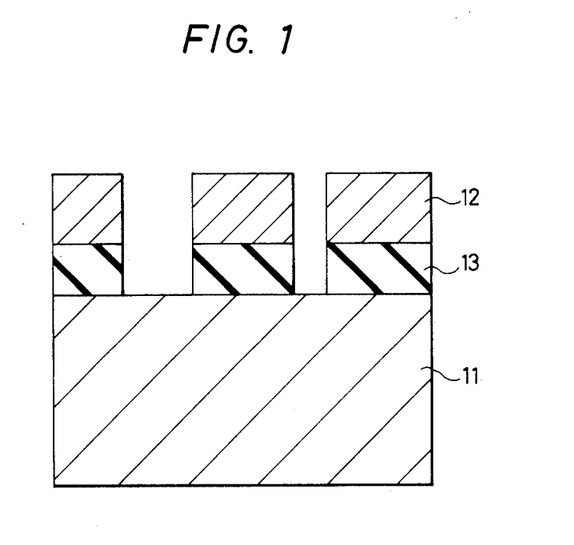
FIG. 1 is an illustrative diagram of the constitution according to the present invention.

As shown in FIG. 1, ion implantation may, of course, be effected in a state of an exposed surface in the applied 10 from which the second film 13 as the lower layer is removed in the opening portions of the mask. Alternatively, however, ion implantation may be effected in a state of the second film 13 remaining in the above-mentioned opening portions after removing only the first film 12. Despite such a state, ion implantation in the above-mentioned substrate can be effected via the second film in the above-mentioned opening portions since the thickness of the second film is small and the ion acceleration energy is large.

EXAMPLE 1

Figure 3A:
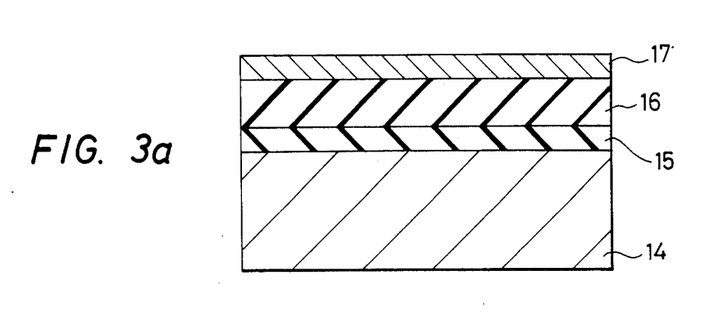
FIGS. 3a to 3c, FIGS. 4a to 4d, FIGS. 5a and 5b, and FIGS. 6a to 6c are diagrams showing different examples according to the present invention.
Figure 3B:
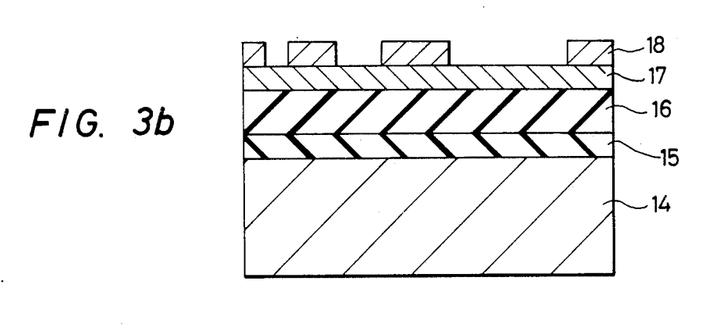
Figure 3C:
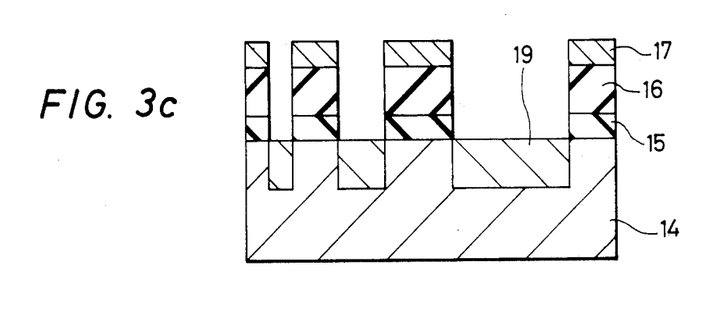

FIGS. 3a to 3c illustrate an embodiment of this invention. FIG. 3a shows a state of stacking of a $SiO_2$ layer 15 of 0.4 μm in thickness grown by wet oxidation on a P type silicon substrate 14 of a (100) face and 10 μcm, a 1.5 μm-thick film 16 of a photoresist AZ1350J (trade name of a product manufactured by Shipley Company Inc.) formed thereon by spin coating and backed at 100° C. for 20 minutes, and a 0.5 μm-thick tungsten (hereinafter referred to briefly as "W") film 17 deposited thereon by sputtering. As shown in FIG. 3b, a 0.5 μm-thick film of a photoresist (AZ1350J) was formed thereon, and unnecessary portions thereof were removed by customary light exposure and development to form a resist pattern 18. As shown in FIG. 3c, the above-mentioned W layer 17, the above-mentioned lower resist layer 16, and the $SiO_2$ layer 15 were processed with the uppermost resist pattern 18 as the initial mask by sequential reactive ion etching procedures (hereinafter referred to briefly as "RIE") to form an ion implantation mask of a three-layer pattern consisting of the $SiO_2$ layer 15, the resist layer 16, and the tungsten layer 17. The resist pattern 18 present in the uppermost portion was removed when the lower resist layer 16 was processed.

$5 \times 10^{12}$ cm$^{-2}$ of boron ions (hereinafter referred to briefly as "B+") were implanted in the silicon substrate 14 with an acceleration energy of 1 MeV with the above-mentioned three-layer pattern as the mask to form a B+ion-implanted layer 19. In this case, the above-mentioned B+ions could be completely blocked by the three-layer mask consisting of the W film 17, the resist film 16, and the $SiO_2$ film 15. Thus an ion-implanted layer 19 could be formed only in the exposed portions of the silicon substrate. Although ion implantation was effected after the surface of the silicon substrate 14 was exposed by removing the $SiO_2$ layer 15 formed on the surface of the silicon substrate 14 according to RIE in this Example, ion implantation can be effected with the $SiO_2$ layer 15 left. In this case, B+ having a high energy can easily penetrate the $SiO_2$ film 15 to form an ion-implanted layer 19. The above-mentioned B+-implanted layer 19 can be employed as a well of C·MOS LSI by annealing after removal of the W layer 17 and the photoresist layer 16 constituting the above-mentioned mask.

In this Example, the W layer 17 and the resist layer 16 were processed according to RIE to form a mask. Thus a good value of about 0.1 μm in dimensional accuracy could be obtained. Besides RIE, other anisotropic processing procedures such as micro-wave plasma etching, photo-excited plasma etching, and radical etching can be employed when forming a mask pattern. According to these procedures, dimensional accuracies equivalent or superior to that in RIE can be obtained.

EXAMPLE 2

In this Example, a mask pattern formation procedure according to the lift-off method will be revealed.

Figure 4A:
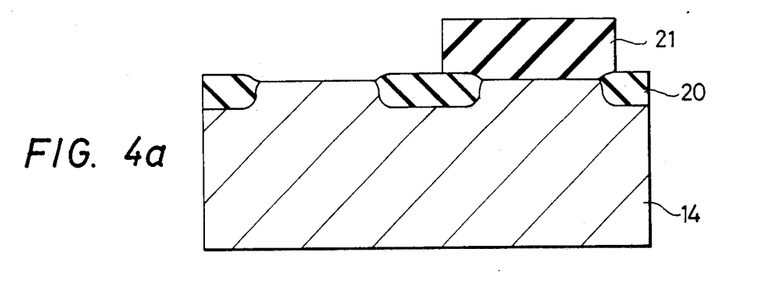
Figure 4B:
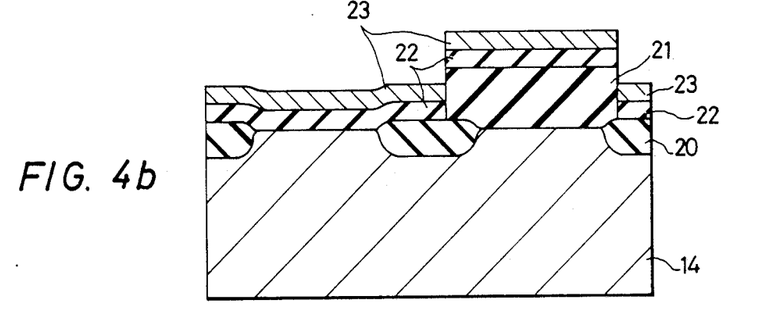
Figure 4C:
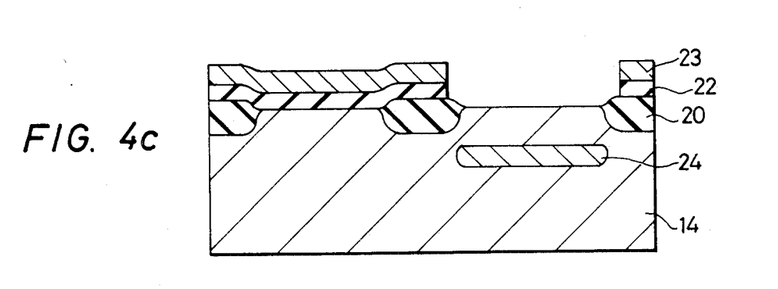
Figure 4D:
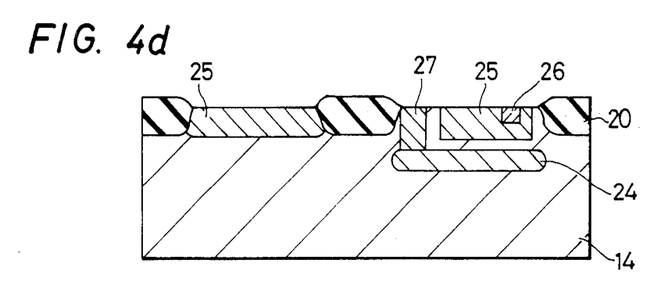

FIG. 4a shows a state of stacking of a 1 μm-thick field oxide film 20 formed on a P type silicon substrate 14 of a (100) face and 10 Ω·cm according to the so-called LOCOS method and a 1.5 μm-thick photoresist pattern 21 formed thereon in the portions of the silicon substrate 14 where ions are to be implanted. As shown in FIG. 4b, a 0.5 μm-thick $SiO_2$ layer 22 and a 0.5 μm-thick W layer 23 on the substrate 14 having the photoresist pattern 21 attached thereto were formed according to the photo-excited CVD method. The layers 22 and 23 were formed using a gas mixture of monosilane ($SiH_4$) and nitrous oxide ($N_2O$) and a gas mixture of tungsten hexafluoride ($WF_2$) and hydrogen ($H_2$) as the respective source gases while irradiating with a xenon lamp. As shown in FIG. 4c, after removal of the above-mentioned resist pattern 21 as well as the $SiO_2$ layer 22 and W layer 23 thereon according to the life-off method, $5 \times 10^{15}$ cm$^{-2}$ of arsenic ions (As+) were implanted in the exposed portion of the substrate 14 at 2 MeV to form an As+-implanted layer 24 in the substrate 14. After removal of the above-mentioned $SiO_2$ layer 22 and W layer 23, the substrate was heat-treated in nitrogen at 950° C. for 30 minutes, followed by formation of a base 25, an emitter 26, and a collector 27 according to the known method. Thus a bipolar transistor having the above-mentioned As+-implanted layer 24 as the buried layer as shown in FIG. 4d was formed.

EXAMPLE 3

This Example will reveal formation of an ion implantation mask consisting of a layer of an organic material having a high heat resistance and a metallic layer deposited thereon according to CVD.

Figure 5A:
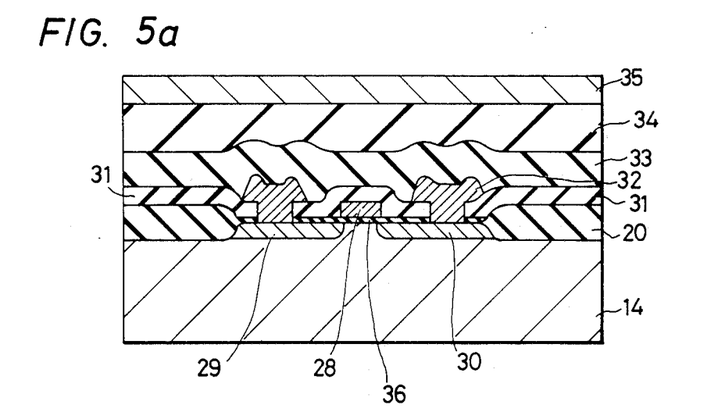
Figure 5B:
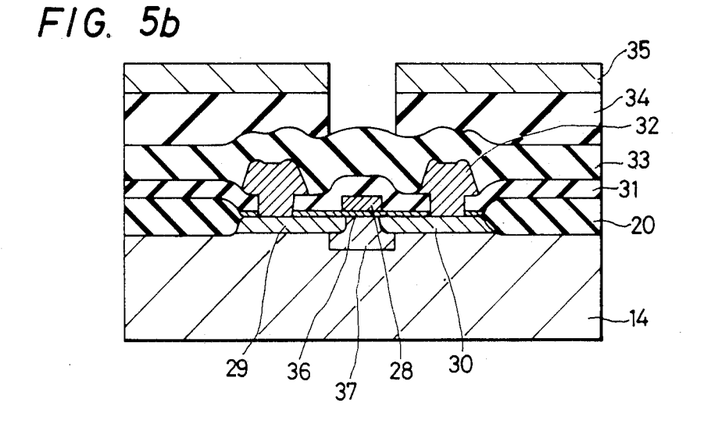

FIG. 5a shows a state of stacking of a MOSFET having a silicon substrate 14, a field oxide film 20, a gate oxide film 36, a gate 28, a source 29, a drain 30, a PSG film 31, an Al wiring 32, and a protective film 33, or a MOSIC having a plurality of MOSFET's; a 2 μm-thick PIQ film 34 formed by spin coating of PIQ (trade name of a thermosetting polyimide resin manufactured by Hitachi Chemical Co., Ltd.) on the MOSFET(s) and baked at 200° C.; and a 1 μm-thick W layer 35 formed on the above-mentioned PIQ film 34 at a substrate temperature of 350° C. according to CVD using a gas mixture of $WF_6$ and $H_2$ as the raw material gas. The portion of the above-mentioned W layer 35 and PIQ layer 34 where ions were to be implanted was removed according to the customary lithography and RIE. $1 \times 10^{13}$ cm$^{-2}$ of B+ ions were implanted at 1.5 MeV to form an ion-implanted layer 37 in the channel portion of the above-mentioned MOSFET as shown in FIG. 3b. Thus, according to this embodiment, the threshold voltage $V_{TH}$ of MOSFET can be controlled by ion implantation in the channel portion after completion of the MOSFET. Also in this case, since the W film 35 and the polyimide film 34 are used as the mask, doping of ions in the channel portion can be very accurately effected without any fear of B+ implantation in the portions other than the channel portion.

EXAMPLE 4

This Example will reveal a method of forming an impurity-doped layer after formation of an isolation portion.

Figure 6A:
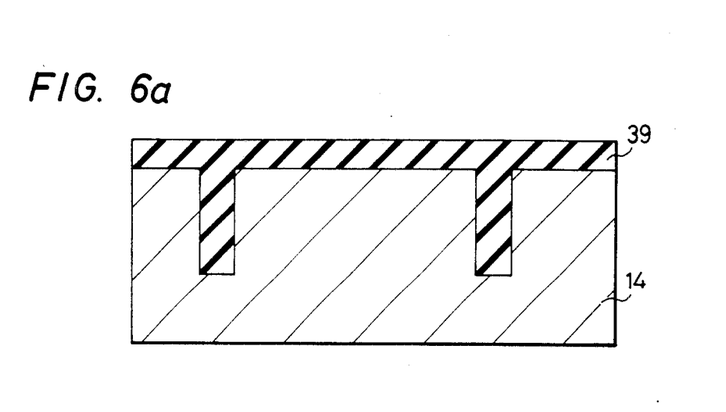

FIG. 6a shows a state of a P type silicon substrate 14 of a (100) face and 10 Ω·cm having a groove of 1 μm in width and 3 μm in depth formed by reactive sputter etching and buried with a 0.7 μm-thick $SiO_2$ film 39 deposited according to the known CVD method.

Figure 6B:
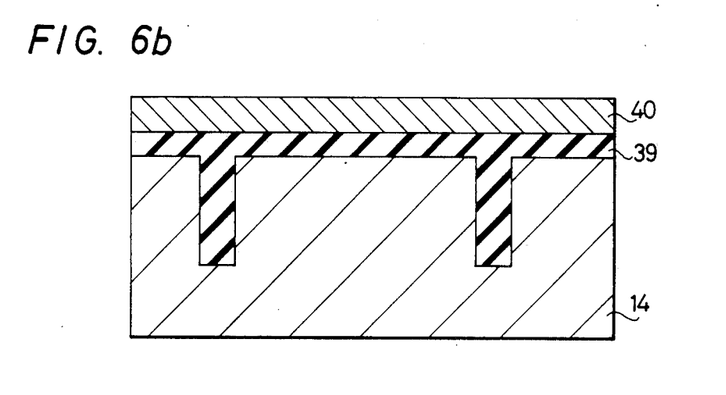

As shown in FIG. 6b, a 1 μ-thick tungsten film 40 was deposited on the above-mentioned $SiO_2$ film 39 according to the known sputtering method.

Figure 6C:
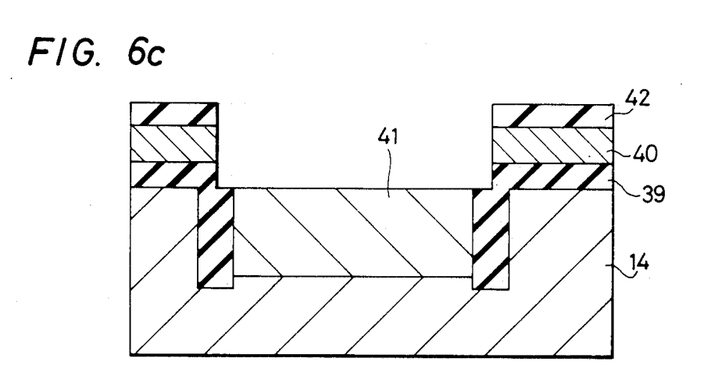

Selective etching of the tungsten film 40 and the $SiO_2$ film 39 was applied with a photoresist 42 as the mask to remove the portion of the tungsten film 40 and the $SiO_2$ film 39 where ions were to be implanted. Subsequently, P ions were implanted in an amount of $1 \times 10^{13}$ cm$^{-2}$ at 2 MeV and in an amount of $1 \times 10^{12}$ cm$^{-2}$ at 500 KeV to form an N type region 41 to be ion-implanted as shown in FIG. 6c.

In this way, an N type well could be formed with a high accuracy. A P type well can also be formed with a high accuracy in the same manner as described above. Although the isolation region was of a well type in this Example, an isolation region of customary LOCOS may, needless to say, be formed. Also in this case, needless to say, an $SiO_2$ film for element separation can be left as it is if only an organic material such as PIQ or a photoresist is used instead of $SiO_2$ as the amorphous material.

The present invention is characterized in that ion implantation is effected with as high an energy as about 500 KeV or more by using a mask of a stacked film consisting of a film formed from an amorphous material such as $SiO_2$ or a photoresist and a film formed from a material having a large mass number, such as tungsten, molybdenum, titanium, tantalum, gold, platinum, or lead.

One kind or a plurality of kinds of elements having a mass number of 45 or more can be used as the material having a large mass number.

Inorganic insulating materials such as $SiO_2$, $Si_3N_4$, and phosphosilicate glass, and other silicate glasses containing impurities and various organic polymer compounds such as polyimide resins and resist materials can be used as the above-mentioned amorphous material employed in the lower layer.

In all of the foregoing Examples, the film of the amorphous material was formed below the film of the material having a large mass number.

In the present invention, however, the position of the above-mentioned film of the amorphous material is not limited to only the lower side of the film of the material having a large mass number. Films of the former type may be disposed both below or above the latter film. In this case, although formation of the mask may be a little more complicated, the total film thickness of the stacked film can be further reduced. Needless to say, the upper and lower amorphous films may be formed from either the same material or mutually different materials.

As is apparent from the above description, according to the present invention, implantation of ions having as high an energy as about 500 KeV or more can be effected using a far thinner mask than the conventional one.

Therefore, ion implantation can be effected without any influence of the shadow of the mask as in the case of a mask having a large thickness according to the conventional ion implantation process.

Moreover, a mask having a small thickness can, needless to say, be easily formed with a very high accuracy. Thus ions having a high energy can be selectively implanted in desired portions with a high accuracy.

What is claimed is:

1. An ion implantation process comprising the steps of forming a stacked film of a second film formed from an amorphous material and a first film formed from a metal having a large mass number on a substrate to be ion-implanted, selectively removing a desired portion(s) of at least said first film to form an opening(s), and implanting ions with an energy of about 500 keV or more through said opening(s) in said substrate.

2. An ion implantation process as claimed in claim 1, wherein said ion implantation is applied after removal of said desired portion(s) of said second film.

3. An ion implantation process as claimed in claim 1, wherein said ion implantation is applied without removal of said desired portion(s) of said second film.

4. An ion implantation process as claimed in claim 1, wherein said metal is one having a mass number of 45 or more.

5. An ion implantation process as claimed in claim 1, wherein said first film has at least a thickness expressed by the following equation:

$$t = k\sqrt{E}$$

wherein t is a thickness (μm) of said first film, E is an acceleration energy (MeV) of ions, and k is a constant dependent on the kind of ions.

6. An ion implantation process as claimed in claim 5, wherein the value of said k is 0.9 for boron ions, 0.45 for phosphorus ions, 0.32 for arsenic ions, and 0.53 for silicon ions.

7. An ion implantation process as claimed in claim 1, wherein said metal is at least one member selected from the group consisting of tungsten, molybdenum, titanium, tantalum, gold, platinum, and lead.

8. An ion implantation process as claimed in claim 1, wherein said second film has at least a thickness expressed by the following equation:

$$t' = 1/\sqrt{M}$$

wherein t' is a thickness of said second film (μm) and M is a mass number of implanted ions.

9. An ion implantation process as claimed in claim 1, wherein said amorphous material is at least one member selected from the group consisting of silicon dioxide, silicon nitride, phosphosilicate glass, organic high polymer resins, and resists.

10. An ion implantation process as claimed in claim 1, wherein said opening(s) is formed by reactive ion, micro-wave plasma, photo-excited plasma, or radical etching.

* * * * *